(12) United States Patent
Sarno et al.

(10) Patent No.: US 7,505,267 B2
(45) Date of Patent: Mar. 17, 2009

(54) COOLING SYSTEM FOR AN ELECTRONIC BOX

(75) Inventors: Claude Sarno, Etoile sur Rhone (FR); Jean-Yves Catros, Toulouse (FR); Pierre Noel, Colombiers (FR)

(73) Assignee: Thales (FR)

( * ) Notice: Subject to any disclaimer, the term of this patent is extended or adjusted under 35 U.S.C. 154(b) by 273 days.

(21) Appl. No.: 10/583,933

(22) PCT Filed: Feb. 1, 2005

(86) PCT No.: PCT/EP2005/050408

§ 371 (c)(1),
(2), (4) Date: Jun. 22, 2006

(87) PCT Pub. No.: WO2005/076685

PCT Pub. Date: Aug. 18, 2005

(65) Prior Publication Data

US 2007/0146998 A1   Jun. 28, 2007

(30) Foreign Application Priority Data

Feb. 3, 2004   (FR) .................................. 04 01004

(51) Int. Cl.
*H05K 7/20* (2006.01)
*B64C 1/00* (2006.01)
*A47C 7/62* (2006.01)

(52) U.S. Cl. .................. 361/700; 257/714; 174/15.1; 165/80.4; 165/104.33; 244/129.1; 244/118.5; 297/217.3

(58) Field of Classification Search ................. 361/699, 361/700; 257/714; 174/15.1, 252; 165/80.4, 165/80.5, 104.33, 41; 244/129.1, 118.5; 297/217.3
See application file for complete search history.

(56) References Cited

U.S. PATENT DOCUMENTS

| 5,409,186 A | 4/1995 | Chow |
| 6,038,426 A * | 3/2000 | Williams, Jr. ................. 725/77 |
| 6,572,054 B1 * | 6/2003 | Smallhorn ................... 244/119 |
| 6,619,588 B2 * | 9/2003 | Lambiaso ................. 244/118.5 |
| 6,824,213 B2 * | 11/2004 | Skelly et al. ............. 297/217.3 |
| 2006/0271970 A1 * | 11/2006 | Mitchell et al. ............... 725/82 |
| 2007/0132288 A1 * | 6/2007 | Zuzga et al. ............. 297/217.3 |
| 2007/0217622 A1 * | 9/2007 | Takeuchi et al. .............. 381/86 |

FOREIGN PATENT DOCUMENTS

| DE | 198 03 764 | 7/1999 |
| DE | 101 60 935 | 7/2003 |
| GB | 1 563 091 | 3/1980 |

* cited by examiner

*Primary Examiner*—Jayprakash N Gandhi
*Assistant Examiner*—Zachary M Pape
(74) *Attorney, Agent, or Firm*—Lowe Hauptman Ham & Berner, LLP

(57) ABSTRACT

The invention relates to a cooling system for an electronic box capable of releasing heat. It comprises a passive cooling device able to be connected to the electronic box and an element consisting of a heat-conducting material, and this element comprises at least one contact region connected to the passive cooling device, this contact region being arranged on the element so as to dissipate the heat coming from the cooling device toward the whole of the element.

5 Claims, 3 Drawing Sheets

COOLING SYSTEM FOR AN ELECTRONIC BOX

CROSS-REFERENCE TO RELATED APPLICATIONS

The present Application is based on International Application No. PCT/EP2005/050408, filed on Feb. 1, 2005, which in turn corresponds to FR 04/01004 filed on Feb. 3, 2004, and priority is hereby claimed under 35 USC 119 based on these applications. Each of these applications are hereby incorporated by reference in their entirety into the present application.

FIELD OF THE INVENTION

The field of the invention is that of cooling electronic equipment, particularly when such equipment is situated in a nonventilated area.

BACKGROUND OF THE INVENTION

This equipment is, for example, in the form of electronic boxes situated under the seats or in the ceilings of an aircraft cabin. These boxes are particularly elements of on-demand audiovisual entertainment systems (films, interactive games, etc.) and of systems allowing access to Internet services and to flight-related services (display of the flight conditions on demand, etc.) made available to the passengers.

This equipment features an ever increasing number of functions and has an ever increasing number of electronic components and/or more powerful components to provide these functions. It therefore tends to dissipate more heat.

It happens to be the case that an aircraft cabin is air-conditioned but not ventilated, that is to say that it does not benefit from forced-air pipes. The problem thus arises of cooling this equipment.

A first solution consists in using natural convection and heat dissipation by way of the seats or the ceilings when the installation allows. However, this technique entails the risk of the air inlets being obstructed and allows only a small quantity of heat to be dissipated.

When the power is high, the boxes are equipped with fans, generally two fans for reasons of reliability. This increases the cost to manufacture the box. This creates maintenance problems, which increase with the number of seats: in the not-too-distant future, some aircraft will be equipped with 800 seats, which will represent 1600 fans to be maintained. Moreover, these fans entail the risk of obstruction and may inconvenience the passengers facing the air outlets. Finally, fans are noisy pieces of equipment.

A key object of the invention is therefore to cool electronic equipment situated, for example, in a non-ventilated area by using a solution which does not have the disadvantages mentioned above.

SUMMARY OF THE INVENTION

To achieve this object, the invention provides a cooling system for an electronic box capable of releasing heat, primarily characterized in that it comprises a passive cooling device able to be connected to the electronic box and an element consisting of a heat-conducting material, and in that this element comprises at least one contact region connected to the passive cooling device, this contact region being arranged on the element so as to dissipate the heat coming from the cooling device toward the whole of the element.

According to one feature of the invention; it additionally comprises an electronic box having an internal heat drainage system joined to a contact region, and in that this contact region of the box is connected to the passive cooling device.

In this way the heat path between the electronic components, the box and the element which dissipates the heat is optimized.

This cooling system is silent, reliable since it does not use any rotating or active elements prone to wear, is compact, requires only-low-level maintenance and is highly flexible in terms of installation.

The passive cooling device is preferably a heat pipe, in particular a heat pipe with a two-phase loop.

Another subject of the invention is a seat equipped with a cooling system as described. This seat is, for example, a seat of a transport vehicle.

The invention also relates to an electronic box having electronic components capable of releasing heat, characterized in that it has an internal heat drainage system joined to a contact region intended to be connected to a passive cooling device.

A final subject of the invention is a method of cooling an electronic box having electronic components capable of releasing heat, characterized in that it includes the following steps consisting in:

draining the heat coming from the components toward a predetermined region of the box, and cooling this region by means of a passive cooling device joined on the one hand to this region of the box and on the other hand to an element capable of dissipating the heat coming from the cooling device.

BRIEF DESCRIPTION OF THE DRAWINGS

Other features and advantages of the invention will become apparent on reading the detailed description below, given by way of nonlimiting example and with reference to the appended drawings, in which.

DETAILED DESCRIPTION OF ILLUSTRATIVE EMBODIMENTS

In the text which follows, it will be assumed that the box is situated in a nonventilated area, the area in this instance being a passenger compartment of an aircraft; however, it goes without saying that the invention also applies to any other nonventilated area such as a train compartment or a car and, more generally, to any insufficiently ventilated area.

According to the invention, the cooling system comprises a passive cooling device connected on the one hand to the electronic box which is to be cooled and on the other hand to the metal structure receiving the box, so as to dissipate the heat toward the structure.

Figure 1:
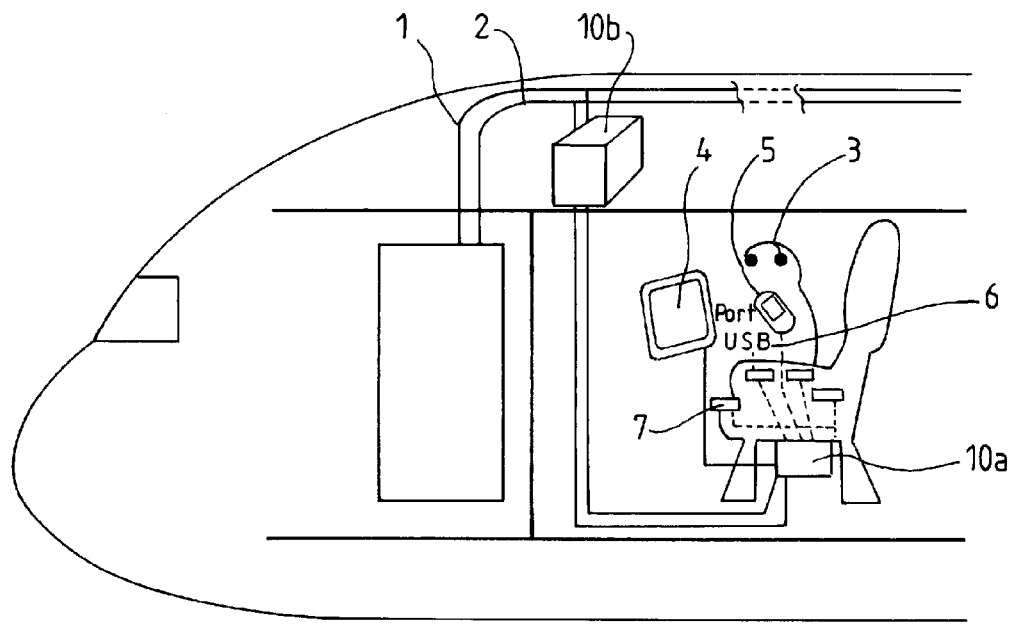
FIG. 1 schematically represents examples of electronic boxes situated in an aircraft compartment, FIG. 2 schematically represents an exploded view of an example of an electronic box according to the invention, FIG. 3 schematically represents a heat pipe, FIG. 4 schematically represents a heat pipe with a two-phase loop, and FIG. 5 schematically represents an example of a cooling system according to the invention.

The receiving structure may be a seat when the box is situated under the seat or an arch of the aircraft structure when the box is situated in the ceiling, as illustrated in FIG. 1.

An electronic box conventionally comprises electronic components such as processors, memories, etc. which are mounted on printed circuits or integrated circuits. The box may also include other electronic components such as a graphics card and/or video card, a sound card, a hard disk, etc. FIG. 1 shows two examples of electronic boxes: one 10a, situated under the seat, is connected on the one hand to the central electrical networks of the aircraft, Ethernet 1, audio and/or video RF network 2, via another box 10b, and, on the other hand, to various terminals, audio headphones 3, video monitor 4, remote control 5, USB port 6 for connection to a portable computer, electrical socket 7, etc.; the other 10b, situated in the ceiling, is connected to the central networks of the aircraft and to the electronic boxes 10a of a number of seats.

In the text which follows, the example which will be taken is that of an electronic box fastened under a seat. This particular case is more critical than if the box were situated in the ceiling, since it is more difficult to access and more liable to be damaged by the passengers.

Figure 2:
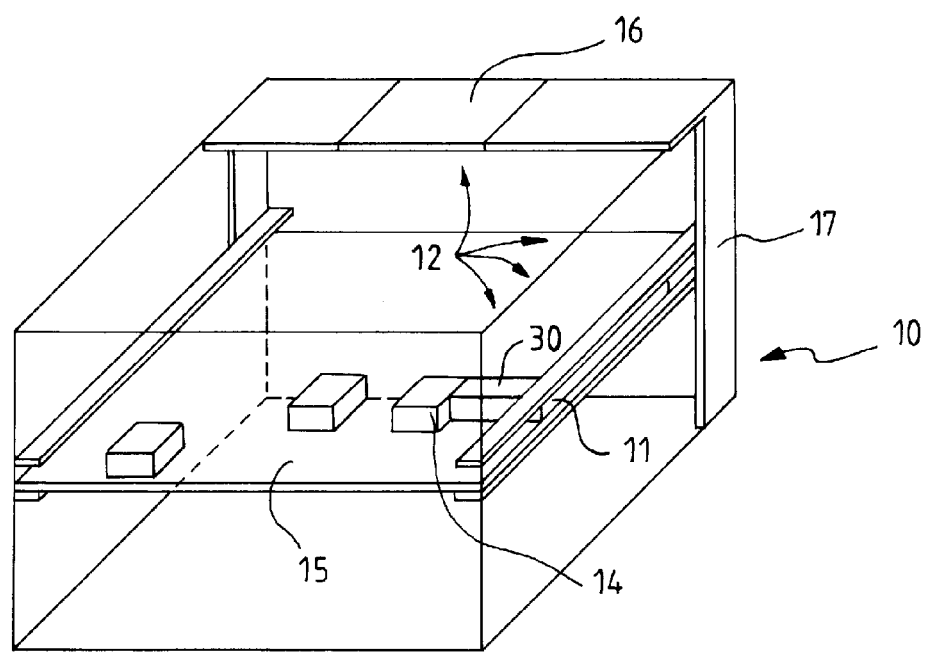

According to the invention, the electronic box 10, which is represented in FIG. 2, for its part has a drainage system 12 for draining the heat released by its electronic components 14 toward a region 16 which is preferably situated on an outer face of the box and which is intended to be connected to a passive cooling device. In the example of FIG. 2, the heat drainage system 12 comprises thermal guide rails 11 situated along the edge of the circuit 15 and in contact with the side walls 17 of the box. The side walls are also in contact with the upper wall which contains the region 16 for cooling the box. According to this cooling system, the heat is drained from the components 14 toward the guide rails 11, then toward the walls 17 and then toward the region 16.

Another example of a drainage system which may be mentioned is a known cooling system with a change of phase such as a heat pipe, sometimes used for discharging heat from components toward the walls of the box.

Figure 3:
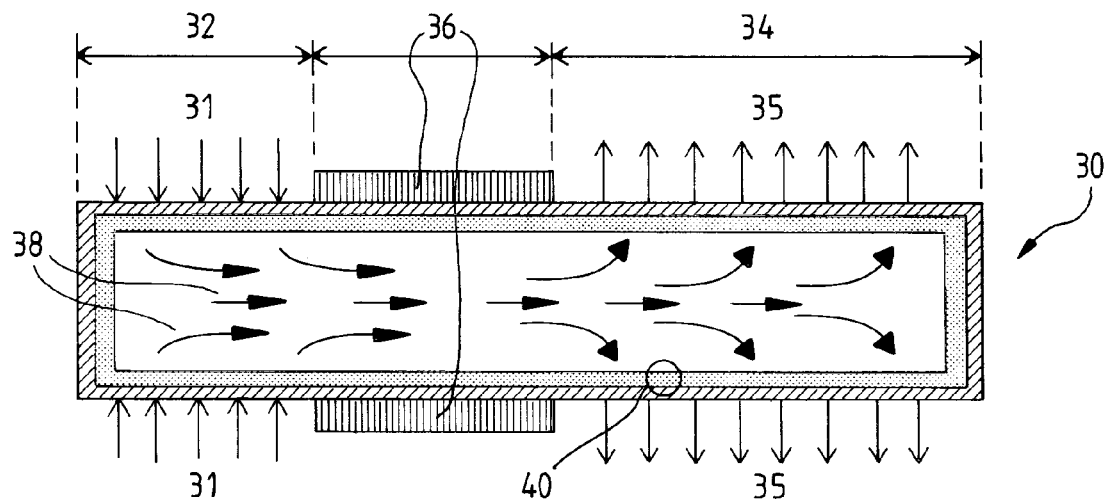

It will be recalled that a heat pipe 30, represented in FIG. 3, mainly comprises an evaporator 32 via which the heat 31 is absorbed and a condenser 34 via which the heat 35 is released. They are separated by an adiabatic region 36. The heat pipe contains a liquid, generally water. When a point on the evaporator is heated, the water is converted into vapor 38 (vapor phase) in the evaporator 32 while absorbing the heat; with the temperature, the pressure of the vapor increases and the vapor 38 flows toward the cooler condenser 34, passing through the adiabatic region 36; there, the steam 38 condenses into water (liquid phase), liberating the heat 35 toward the outside of the heat pipe 30, and the liquid returns toward the evaporator 32 by capillary action, crossing a capillary structure 40 containing a number of ducts, for example.

When the box 10 is equipped with a heat pipe, the region 16 intended to be connected to a cooling device 20 is that of the condenser 34. More generally, this region 16 is that at which the heat of the box is drained.

Up until now, heat pipes have been used to cool electronic boxes as indicated above, such as portable computers whose operating temperature easily reaches 40° C. The distance over which the heat is drained is around 20 cm.

Figure 4:
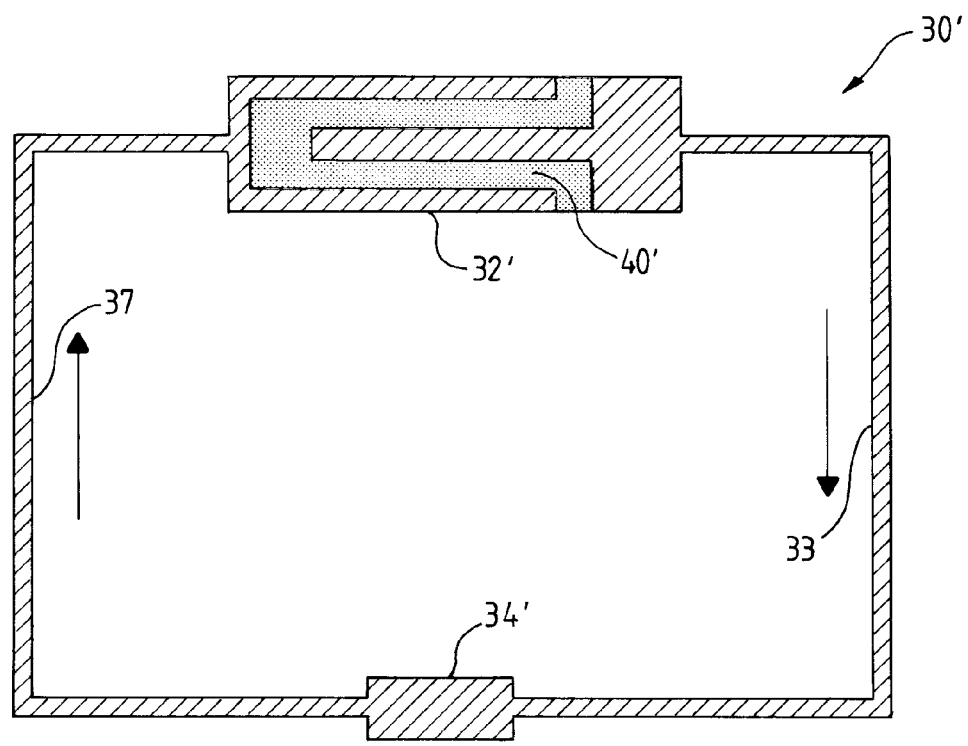

According to one embodiment of the invention, the passive cooling device 20 situated between the box and the metal structure of the seat is also a heat pipe in spite of the unusual particular requirements concerning its use. Specifically, the particular requirements for use in the aeronautical field comprise the ability to withstand higher temperatures, possibly reaching 70° C. in the case of boxes having a volume of about 1 or 2 MCU (1 MCU=1.6 liters), longer heat draining distances of around 60 cm, and a resistance to acceleration which must not prevent the capillary action from taking place. This resistance must be less than 10 g, where g The heat pipe used is as represented in FIG. 3, or a variant represented in FIG. 4 and denoted heat pipe 30' with a two-phase loop, which is based on the same operating principle. In this variant, the evaporator 32' and the condenser 34' are joined by a vapor flow line 33 and a liquid flow line 37. A capillary pump 40' is integrated within the evaporator 32' as illustrated in FIG. 4. These flow lines 33 and 37 can be made of a deformable material which allows easy connection between the evaporator 32' in contact with the region 16 of the box and the condenser 34'. These deformable flow lines facilitate the installation of this cooling device 20.

Figure 5:
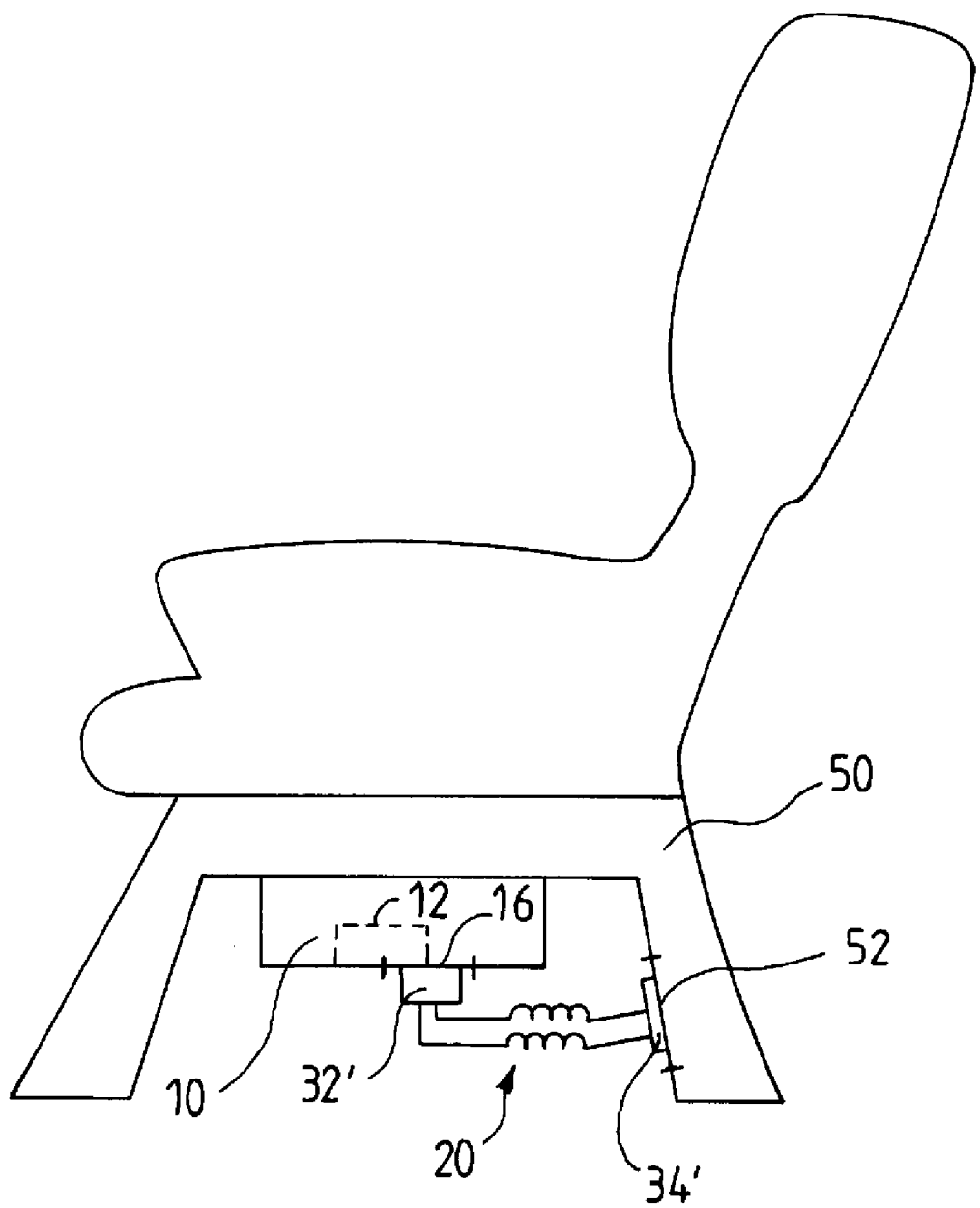

According to the invention, the cooling device 20 is joined to part of the seat, this seat part consisting of a heat-conducting material which may be metal. The part in question may be the legs of the seat, for example. As illustrated in FIG. 5, this metal part 50 comprises a contact region 52 intended to be connected to the cooling device 20, more specifically to the condenser 34' of this device. The heat coming from the condenser 34' is thus dissipated toward the whole of the metal structure 50 of the seat.

In this way the heat path between the electronic components, the box and the metal structure of the seat is optimized.

This overall cooling system is silent, reliable since it does not use any rotating or active elements prone to wear, is compact, requires no maintenance and is highly flexible in terms of installation.

According to a specific embodiment, the cooling device 20 has a plurality of condensers 34' and the receiving structure has a plurality of contact regions 52.

The invention claimed is:

1. An aircraft seat, the seat being equipped with an electronic box capable of releasing heat, comprising:
   a heat pipe with a two-phase loop connected to the electronic box and an element having a heat-conducting material, wherein said element includes a contact region connected to the heat pipe, said contact region being arranged on the element so as to dissipate the heat coming from the heat pipe toward the whole of the element.

2. The aircraft seat as claimed in claim 1, wherein the electronic box has an internal heat drainage system joined to a contact region of the box, and in that this contact region is connected to the heat pipe.

3. The aircraft seat as claimed in claim 1, wherein the electronic box has walls and in that the contact region is part of a wall.

4. The aircraft seat as claimed in claim 3, wherein the box includes electronic components which release heat, the contact region of the box being connected to the heat pipe.

5. A method of cooling an electronic box associated with an aircraft seat as claimed in claim 4 having electronic components which release heat, comprising:
   draining the heat coming from the components toward a predetermined region of the box, this region being part of a wall, and cooling this region by means of a heat pipe joined to this region of the box and to an element capable of dissipating the heat coming from the heat pipe.

* * * * *